(12) United States Patent
Gordon et al.

(10) Patent No.: US 7,754,985 B2
(45) Date of Patent: *Jul. 13, 2010

(54) ELECTRONIC SWITCH ASSEMBLY WITH CONFIGURABLE FUNCTIONALITY

(75) Inventors: David Scott Gordon, Hillsboro, ND (US); Michael Ray Schlichtmann, Fargo, ND (US); Jon Thomas Jacobson, Fargo, ND (US)

(73) Assignee: Deere & Company, Moline, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/056,589

(22) Filed: Mar. 27, 2008

(65) Prior Publication Data
US 2008/0245876 A1 Oct. 9, 2008

Related U.S. Application Data

(63) Continuation-in-part of application No. 11/695,639, filed on Apr. 3, 2007, now Pat. No. 7,554,044.

(51) Int. Cl.
*H01H 9/00* (2006.01)
(52) U.S. Cl. ............... 200/1 R; 200/339; 200/553; 307/112; 361/673
(58) Field of Classification Search ............... 200/4, 200/341, 345, 1 R, 5 R, 292, 293, 296, 339, 200/553; 307/9.1, 10.8, 112, 139; 361/673
See application file for complete search history.

(56) References Cited

U.S. PATENT DOCUMENTS

| 4,048,672 | A | | 9/1977 | Seiden et al. |
|---|---|---|---|---|
| 6,140,593 | A | * | 10/2000 | Bramesfeld et al. ......... 200/5 A |
| 6,837,725 | B1 | | 1/2005 | Gordon et al. |
| 6,841,895 | B1 | | 1/2005 | Kelwaski |
| 7,554,044 | B2 | * | 6/2009 | Gordon et al. ............... 200/5 R |
| 2001/0048247 | A1 | | 12/2001 | Bae et al. |
| 2004/0154907 | A1 | | 8/2004 | Blossfeld et al. |
| 2004/0245855 | A1 | | 12/2004 | Bachle |
| 2006/0119570 | A1 | | 6/2006 | Searle et al. |
| 2007/0052298 | A1 | | 3/2007 | Merkel et al. |
| 2007/0062787 | A1 | | 3/2007 | Miura et al. |

OTHER PUBLICATIONS

AMETEK Dixson. Product Information Note 072-40243, User Guide for the SmartGage Handheld Tool. Initial Release Date Feb. 25, 1998, Revision Date Jan. 1, 2007.

Chorded keyboard. Wikipedia, the free encyclopedia Website. Pages modified Jan. 1, 2008. [online]. [Retrieved on Jan. 24, 2008]. Retrieved from the Internet:<URL: http://en.wikipedia.org/wiki/Chorded_keyboard>.

* cited by examiner

*Primary Examiner*—Kyung Lee

(57) ABSTRACT

An electrical switch assembly comprises a generally planar substrate. A functional switch and at least one identification switch are mounted to the substrate. A switch body supports a switch actuator which is movable between multiple positions. An arrangement of one or more projecting members extends from the switch body. The switch body is mounted on or to the substrate such that the switch actuator operatively engages the functional switch, and the arrangement of projecting members operatively engages at least one of the identification switches to create a unique electronic identifier for the electrical switch assembly.

24 Claims, 4 Drawing Sheets

ELECTRONIC SWITCH ASSEMBLY WITH CONFIGURABLE FUNCTIONALITY

CROSS REFERENCES TO RELATED APPLICATIONS

This application is a continuation-in-part of U.S. application Ser. No. 11/695,639, filed on Apr. 3, 2007 now U.S. Pat. No. 7,554,044.

FIELD OF THE INVENTION

The present invention relates to an electronic switch assembly with configurable functionality.

BACKGROUND OF THE INVENTION

A control assembly of a vehicle may use one or more electrical switches to enable or disable various features or functions of the vehicle, its systems, or its accessories. For example, an electrical switch may energize or de-energize a particular electrical or electronic device, or terminal thereof, to carry out a designated function. In some configurations, the designated function of a corresponding switch is configured by circuitry or hardware that is connected to the switch and an electronic device to be controlled. In other configurations, the designated function of a corresponding switch is configured by software instructions or code that indirectly or directly controls the electronic device. In the latter configuration or variations thereof, a switch assembly is needed that can facilitate automatic configuration (e.g., self-configuration) or assignment of designated functions of the control assembly, without any mandatory requirement for writing software instructions or code to achieve desired functionality of the control assembly.

SUMMARY OF THE INVENTION

In accordance with one embodiment, an electrical switch assembly comprises a generally planar substrate. A functional switch and at least one identification switch are mounted to the substrate. A switch body supports a switch actuator which is movable between multiple positions. An arrangement of one or more projecting members extends from the switch body. The switch body is associated with (e.g., mounted on or above) the substrate such that the switch actuator operatively engages the functional switch, and the arrangement of projecting members operatively engages at least one of the identification switches to create a unique electronic identifier for the electrical switch assembly.

DETAILED DESCRIPTION OF THE INVENTION

Figure 1A:
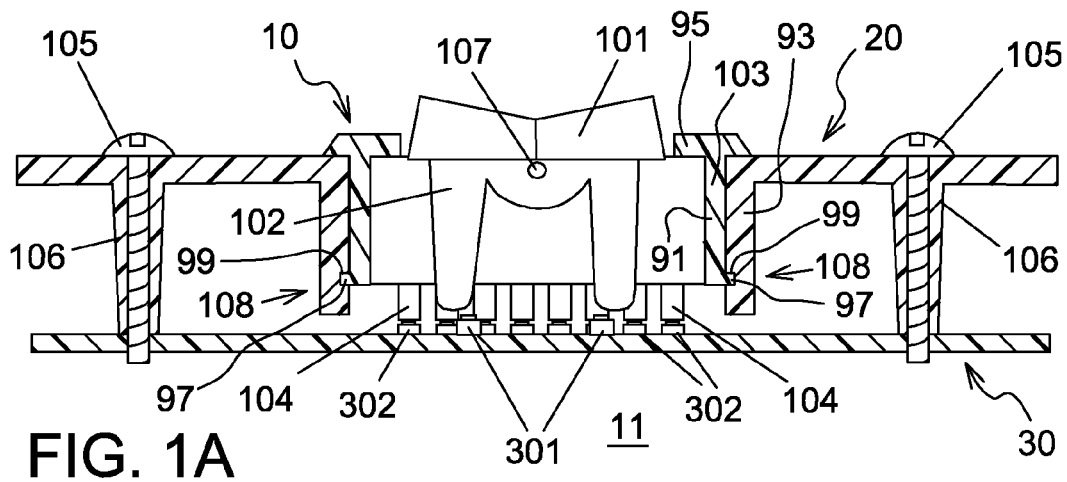
FIG. 1A through FIG. 1C, inclusive, are cross-sectional views of an electrical switch assembly, with an actuator of the switch assembly in possible alternate positions.

Referring to FIG. 1A, an electrical switch assembly 11 comprises a generally planar substrate 30. At least one functional switch 301 and at least one identification switch 302 are mounted to the substrate 30. A switch body 10 supports a switch actuator 102 which is movable between multiple positions, such as a first position (e.g., neutral position) in FIG. 1A, a second position in FIG. 1B, and a third position in FIG. 1C. An arrangement of one or more projecting members 104 extends from the switch body 10. In one embodiment, the switch body 10 is associated with (e.g., mounted above or on) the substrate 30 such that the switch actuator 102 operatively engages the functional switch 301, and the arrangement of projecting members 104 operatively engages at least one of the identification switches 302 to create a unique electronic identifier for the electrical switch assembly. A panel cover 20 or similar structure is mounted to the substrate 30 and holds the switch body 10 securely in position over the substrate 30, ensuring the proper compression or compressive force of the projecting members 104 against movable activating members of the identification switches 302.

Figure 2:
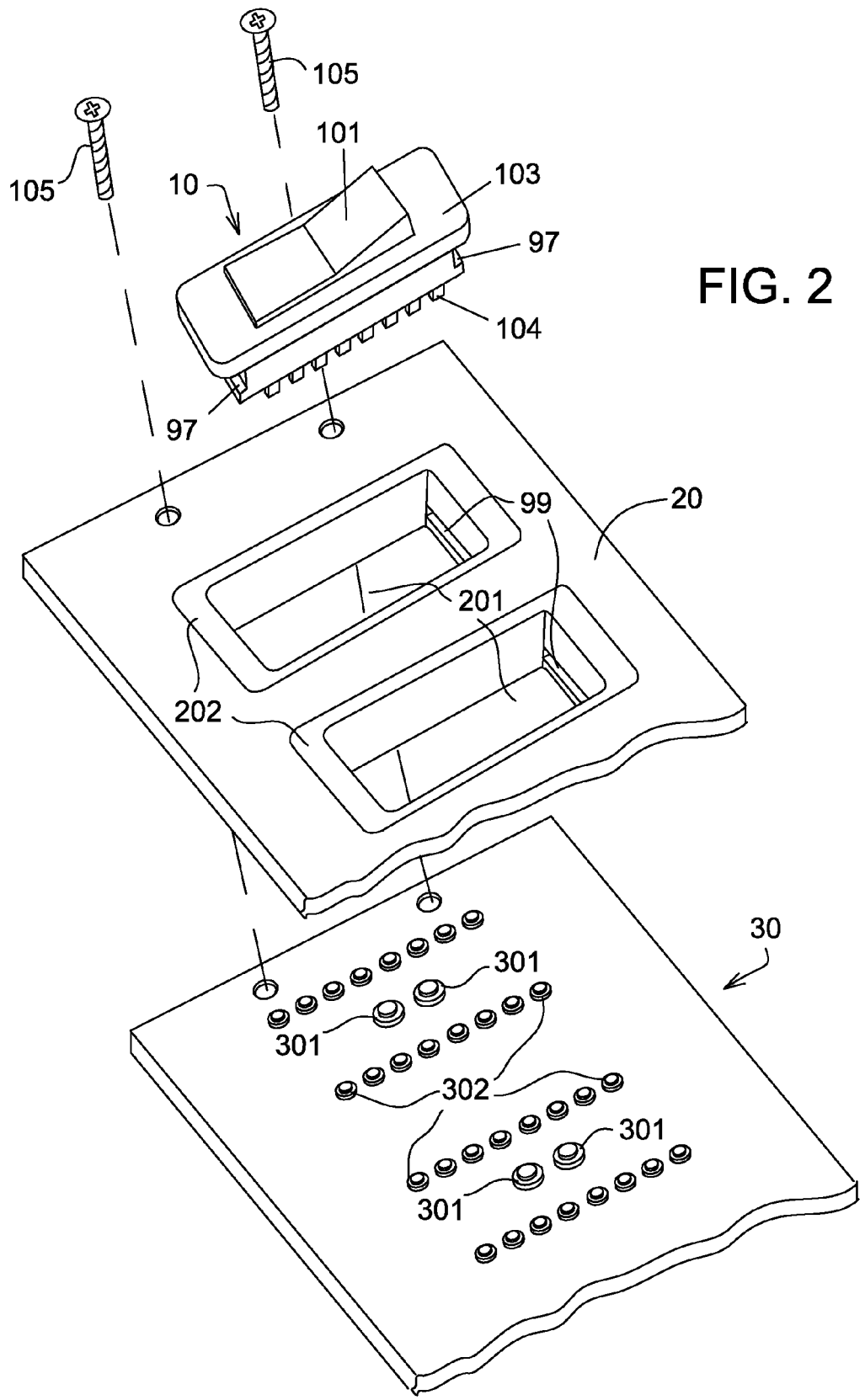
FIG. 2 is an exploded perspective view of the electrical switch assembly.

The substrate 30 may comprise a circuit board, a printed circuit board, a polymer with conductive traces, a ceramic board with conductive traces, a fiberglass board with conductive traces, or another dielectric material with conductive traces that provides interconnections between electrical components or circuitry. As shown in FIG. 1A and FIG. 2, the substrate 30 has functional switches 301 and identification switches 302 mounted on or to the substrate 30. The substrate 30 may support electrical connections or conductive traces between the switch terminals and a data processor (e.g., data processor 303 of FIG. 4), for example.

The functional switches 301 and identification switches 302 may comprise surface-mount components or through-hole mounted components, for example. In one configuration, each of the functional switches 301 and the identification switches 302 may comprises a contact switch (e.g., a momentary contact switch or a maintained contact switch) associated with a first electrical state that changes to a second electrical state, distinct from the first electrical state, in response to the identification switch being engaged by a corresponding projecting member 104 of the arrangement. A contact switch may comprise a momentary contact switch that changes from a first electrical state to a second electrical state as long as the switch is depressed. Alternatively, a maintained contact switch has an electrical or mechanical latching mechanism that changes from a first electrical state to a second electrical state upon contact, even if the switch is no longer depressed. The maintained contact switch may feature a controlled release mechanism to revert back to the first electrical state.

Each functional switch 301 may be configured in a normally open state or normally closed state. Similarly, each identification switch 302 may be configured in a normally open or a normally closed state. There is no restriction on using a group of identification switches 302 that is mixture of normally open and normally closed configurations. Similarly, there is no restriction on using a group of functional switches 301 that is a mixture of normally open and normally closed configurations. If the identification switches 302 comprise momentary contact switches and if each of the contact switches has a normally open state, then at least a subset of the contact switches will have a closed state in response to engagement of the subset by the arrangement of projecting members 104. Conversely, if each of identification switches comprise momentary contact switches and if each of the contact switches having a normally closed state, then at least a subset of the contact switches will have an open state in response to engagement of the subset by the arrangement of projecting members 104.

The panel cover 20 or similar supporting structure may be connected to or mounted to the substrate 30 with one or more fasteners 105, or otherwise. Each fastener 105 may comprise a screw, bolt, threaded member, snap-fit connector, rivet or another mechanical fastening or bonding device. As shown in FIG. 1A, the fasteners 105 are placed through bores in the panel cover 20 and mechanical standoffs 106 or spacers. The standoffs 106 comprise spacers that extend from one side of the panel cover 20. The standoffs 106 may be embodied as extensions molded with the panel cover 20, or may be separate members. The panel cover 20 is spaced apart from the substrate 30 by a spacing determined by at least one of a standoff 106 and a spacer such that the projecting members 104 retained by or within the panel cover 20 depress the subset of the identification switches 302 by a desired displacement to actuate reliably the subset. For example, the standoffs or spacers are sized in height such that they ensure proper spacing between the panel cover 20 and the substrate 30, such that the actuator 102 depresses the functional switches 301 by a desired displacement (e.g., vertical displacement in the first position of FIG. 1A and the third position of FIG. 1C) and such that the projecting members 104 (e.g., on the switch body retained by a snap-fit connector) depress the identification switches 303 by a desired displacement (e.g., vertical displacement).

Figure 1B:
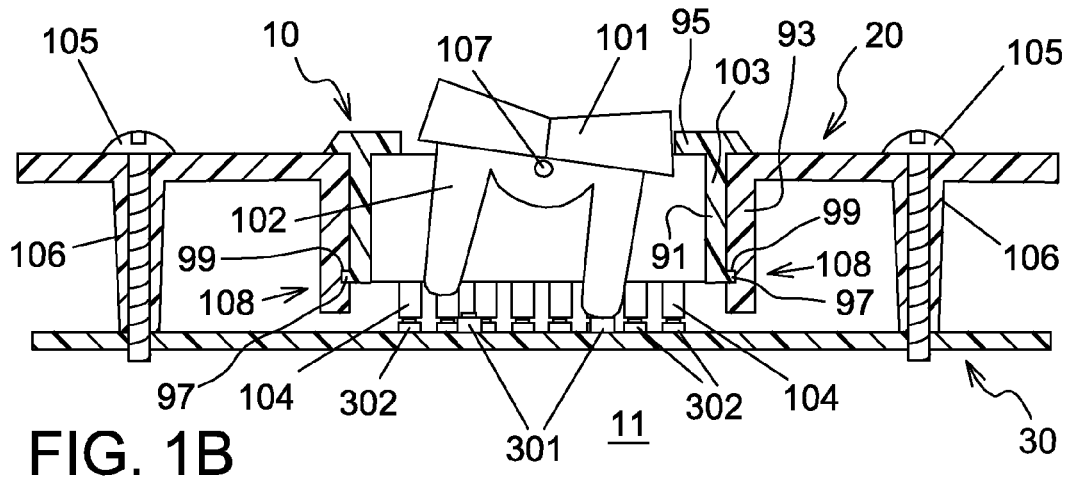
Figure 1C:
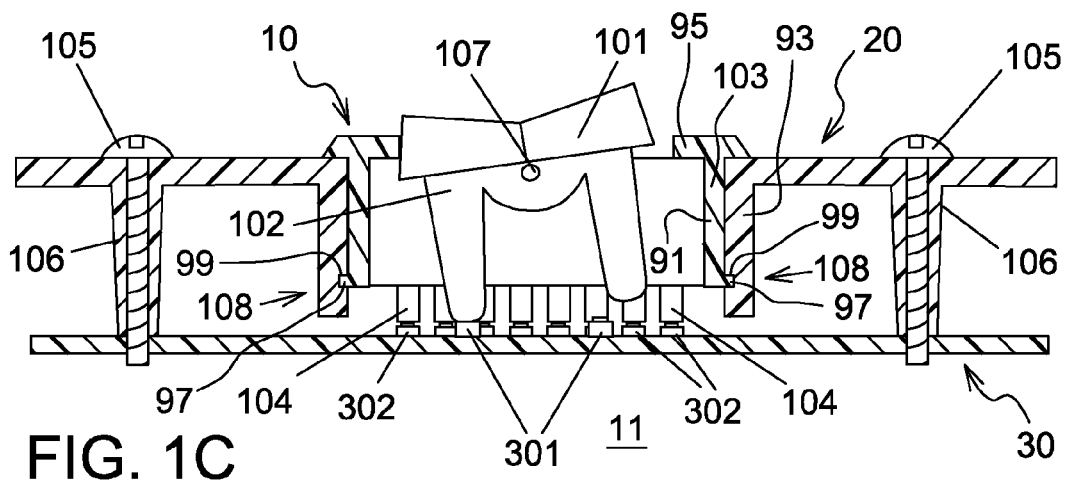

Although FIG. 1A through FIG. 1C show threaded fasteners 105 placed through standoffs 106, in an alternative embodiment, adhesives, solder, or other mounting arrangements for mounting the panel cover 20 to the substrate 30 can be used.

In FIG. 1A, FIG. 1B, FIG. 1C and FIG. 2, the panel cover 20 and outer enclosure 103 are associated with snap-fit connectors 108. The snap-fit connectors 108 are arranged to secure or retain the switch body 10 to the panel cover 20 or a similar supporting structure. A first portion 97 of the snap-fit connector is associated with (e.g., an outer perimeter) of the switch body 10. A first portion 97 of each snap-fit connector 108 flexes inward or elastically deforms when the outer enclosure 103 or switch body 10 is inserted into a panel cover opening 201 (FIG. 2) in the panel cover 20 or a similar supporting structure. The first portion 97 of each snap-fit connector 108 expands or deflects into the corresponding second portion 99 or recess when the outer enclosure 103 has been inserted far enough into the panel cover opening 201. The second portion 99 of the snap fit connector 108 is associated with a wall 93 in the panel cover 20. The second portion 99 comprises a groove or recess in a wall 93 of the panel cover 20 or similar supporting structure.

Figure 3:
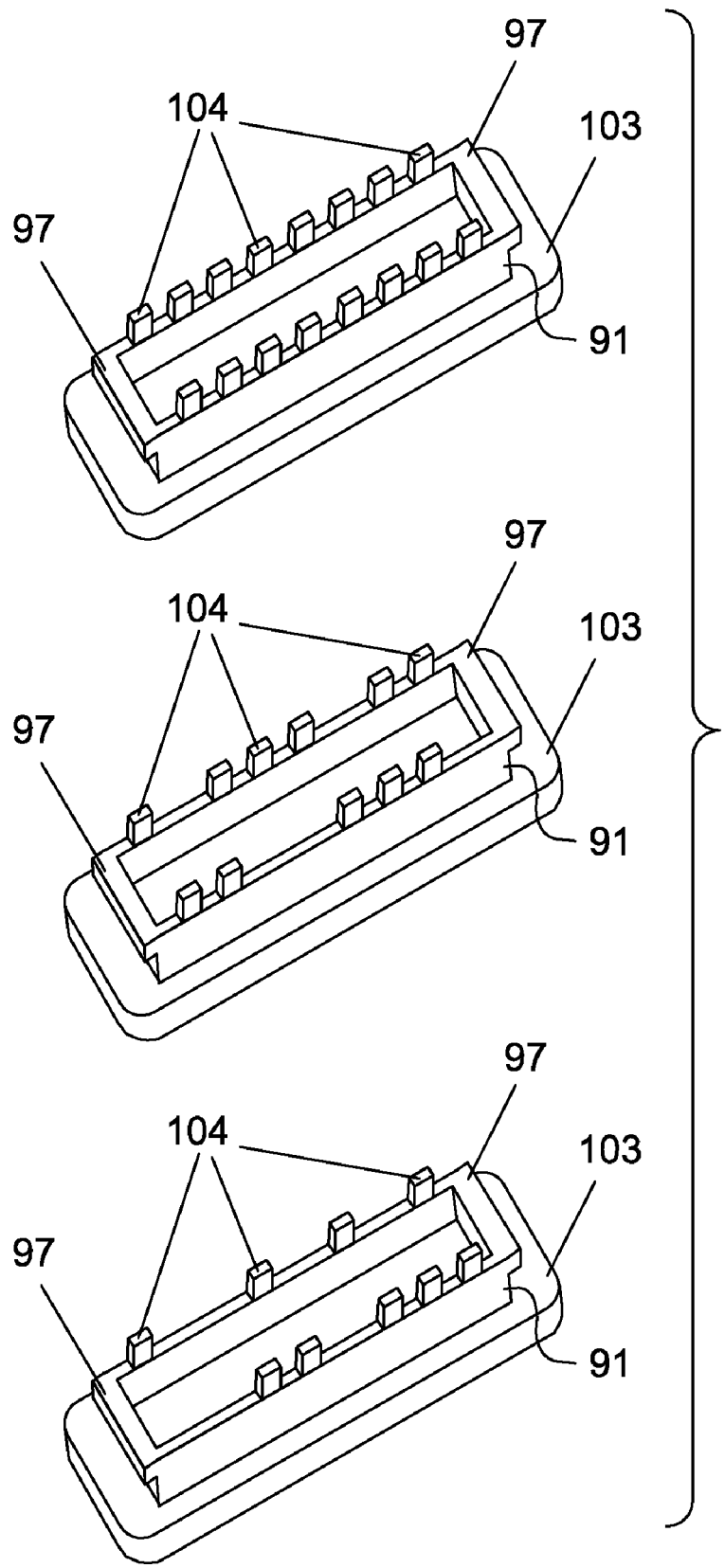
FIG. 3 is a bottom perspective view of possible variations of the projecting members of the electrical switch assembly.

In one embodiment, as illustrated in FIG. 3, each panel cover opening 201 features a mating surface 202 that supports the placement of a seal, a gasket, an adhesive, an elastomer, or an adhesive sealant between the mating surface 202 and the outer enclosure 103 or a flange of the outer enclosure 103. The mating surface 202 supports the formation and maintenance of an environmental seal or water-resistant seal with the outer enclosure 103 to prevent the ingress of dirt, dust, debris, water, or moisture that might otherwise interfere with the proper operation and reliability of the identification and functional switches (301, 302).

The switch body 10 comprises an outer enclosure 103 and a switch actuator 102. The outer enclosure 103 supports the switch actuator 102. The outer enclosure 103 has a top portion 95 and a generally rectangular lower wall 91 extending from the top portion 95. Other configurations of the outer enclosure 103 are possible provided that the outer enclosure 103 provides structural support for mounting the switch body 10 and supports movement of the actuator 102. The switch actuator 102 is mounted on a pivot point 107 or shaft inside the outer enclosure 103. The pivot point 107 or shaft may be secured to or connected to (e.g., two opposite walls or sides of) the switch body 10 or the outer enclosure 103. The switch body 10 or outer enclosure 103 terminates in a first portion 97 of a snap-fit connector 108. The panel 20 has a wall 93 that is associated with a second portion 99 of snap-fit connector 108. The second portion 99 (e.g., groove or recess) mates with the first portion 97 (e.g., protrusion, tab, or tongue). As shown in FIG. 1A, the first portion 97 is shown as a protrusion, whereas the second portion 99 is shown as a recess in the wall 93. However, in an alternative embodiment, the first portion of the snap-fit connector 108 may comprise a recess and the second portion may comprise a protrusion or ridge in the wall.

The snap-fit connectors 108 and standoffs 106 cooperate to facilitate the proper positioning, alignment or registration of the switch body 10 and its actuator 102 with respect to the substrate 30 and its functional switch or switches 301. Similarly, the snap-fit connectors 108 cooperate to facilitate the proper position, alignment and registration of the switch body 10 and its projecting members 104 with respect to the substrate and its identification switches 302. The foregoing alignment and registration is such that proper compression (e.g., compressive force) and/or a target displacement (e.g., vertical displacement) is placed on the identification switches 302 by the projecting members 104 for reliable activation of the identification switches 302. The proper compression and target displacement may be specified by the manufacturer of the identification switches 302 or may be determined by testing of the switch assembly 11 (e.g., incident to accelerated life tests). The actual compression and displacement on the identification switches 302 may vary depending upon the thermal stress on the switch assembly 11, manufacturing tolerances, and differential thermal coefficients of expansion of the substrate 30, the panel cover 20 and the switch body 10. Accordingly, to reduce any differential in thermal expansion between the components; the substrate 30, the panel cover, and the switch body 10 may be composed of the same or similar material composition (e.g., polymer, polymeric matrix and filler, plastic or plastic matrix and filler).

If the switch body 10 is pressed into place in the panel cover 20, any projecting members 104 that are present on the bottom of the outer enclosure 103 engage a corresponding identification switch 302 on the substrate 30. Each unique configuration of projecting members 104 will activate a respective unique subset of the identification switches 302. The activated subset of identification switches 302 provides a unique electronic identification for each switch body 10 installed. In practice, the unique electronic identification may be used to impart or assign different functions to different corresponding switch bodies (10) or functional switches 301 on the substrate.

An upper portion 101 of the switch body 10 or actuator 102 may comprise a cap or button that a user may use to activate the switch actuator 102. As illustrated in FIG. 1A, the switch assembly 11 is in a neutral or inactive condition in which no functional switch 301 is activated by the actuator 102 pressing on it. However, the electrical state of the functional switches 301 may depend upon whether each functional switch 301 is in a normally one or normally closed state, for example.

If a user presses on (e.g., either side of) the upper portion 101, the switch actuator 102 rotates on the pivot point 107. If rotated, the switch actuator 102 moves such that it operatively engages a first one of the functional switches 301 in a first position of the actuator 102 as shown in FIG. 1B or a second one of the functional switches 301 in a second position of the actuator 102 as shown in FIG. 1C. In one embodiment, the functional switch 301 remains engaged while the switch actuator 102 stays in this rotated position, and a locking or detent mechanism may be associated with the switch assembly 11 to maintain the rotated position, the first position or the second position. If the switch actuator 102 is returned to its non-rotated position, as shown in FIG. 1A, the functional switches 301 are released or disengaged.

Although FIGS. 1A, 1B, and 1C show a switch actuator 102 with two extending portions operatively engaging two functional switches 301, in an alternate embodiment, the switch actuator 102 may have a single portion that engages only one corresponding functional switch 301. Accordingly, where only one functional switch 301 is used in the switch assembly with an alternate actuator, only two positions of the actuator may be supported: a neutral position and an active position in which a single functional 301 switch is engaged (e.g., activated).

The functional switches 301 may be implemented as momentary pushbutton switches, slider switches, or as simple deformable or elastic electrical connections on the substrate 30 which are connected when the actuator 102 is in the "on" position. Any other appropriate configuration or style of switch actuator 102 and functional switches 301 may be used.

FIG. 2 shows an exploded view of the switch assembly 11. The switch assembly 11 comprises the switch body 10 that is connected to the panel cover 2-, which provides proper alignment with respect to the substrate 30 and switches (301, 302) mounted thereon. The substrate 30 may feature a full complement of identification switches 302 or a limited number of identification switches 302, depending upon a desired number of functions to be supported. For example, where M is the number of identification switches 302, $2^M$ possible functions of the functional switches 301 are supported. Each function may be associated with one or more functional devices (e.g., 304 in FIG. 4). The mating surfaces 202 and openings 201 in the cover panel 20, along with other elements set forth in FIG. 2, were previously described in conjunction with FIG. 1A through FIG. 1C.

FIG. 3 shows three possible configurations of projecting members 104 on three different outer enclosures 103. Although each projecting member 104 is illustrated as a tooth or rectangular projection, each projecting member 104 may have another geometric shape, such as generally cylindrical, columnar, conical, or polygonal. Each projecting member activates one corresponding identification switch. Each identification switch may have one of two electrical states: an active state and an inactive state. In one illustrative example, the active state may be associated with a logic level high, a contact closure, or another designated electrical characteristic, whereas an inactive state may be associated with a logic level low, an open contact, a grounded connection, or another designated electrical characteristic. An identification switch may provide a normally open or normally closed contact configuration.

Although FIG. 3 shows three possible configurations of projection members 104, there are many possible configurations of projecting members 104 that can fall within the scope of the claims. In some configurations, the maximum number of projecting members 104 is limited by the size of the outer enclosure 103 and the minimum size and spacing requirements of the corresponding identification switches 302. In one embodiment, the minimum number of projecting members 104 may be zero. An outer enclosure 103 with zero projecting members 104 would activate none of the corresponding identification switches 302.

In another embodiment, a design for an outer enclosure 103 featuring a maximum of eight projecting members 104 would be capable of generating 2 to the eighth power, or 256, unique control identifiers, ranging from 0 (no projecting members populated) to 255 (with all projecting members 104 populated). Increasing the number of projecting members to 10 would offer 1,024 unique identifiers for different corresponding functions or features of electronic or electrical devices to be activated, inactivated or otherwise controlled.

In one illustrative embodiment, the outer enclosures 103 are first produced or manufactured with all projecting members 104 populated or present. Then, a secondary process may be used to remove the unwanted projecting members 104 to achieve a corresponding desired or target function associated with the remaining projecting members 104. The secondary process may be a clipping, cutting, severing, grinding or ablation operation, for instance. Although a unique mold could be created for each possible arrangement of projecting members 104, it could be impractical for low volume applications where a high number of molds required.

An alternate procedure for creating the unique outer enclosures 103 would be for the projecting members 104 to be separate components which must be installed in matching receptacles on the outer enclosure 103.

Figure 4:
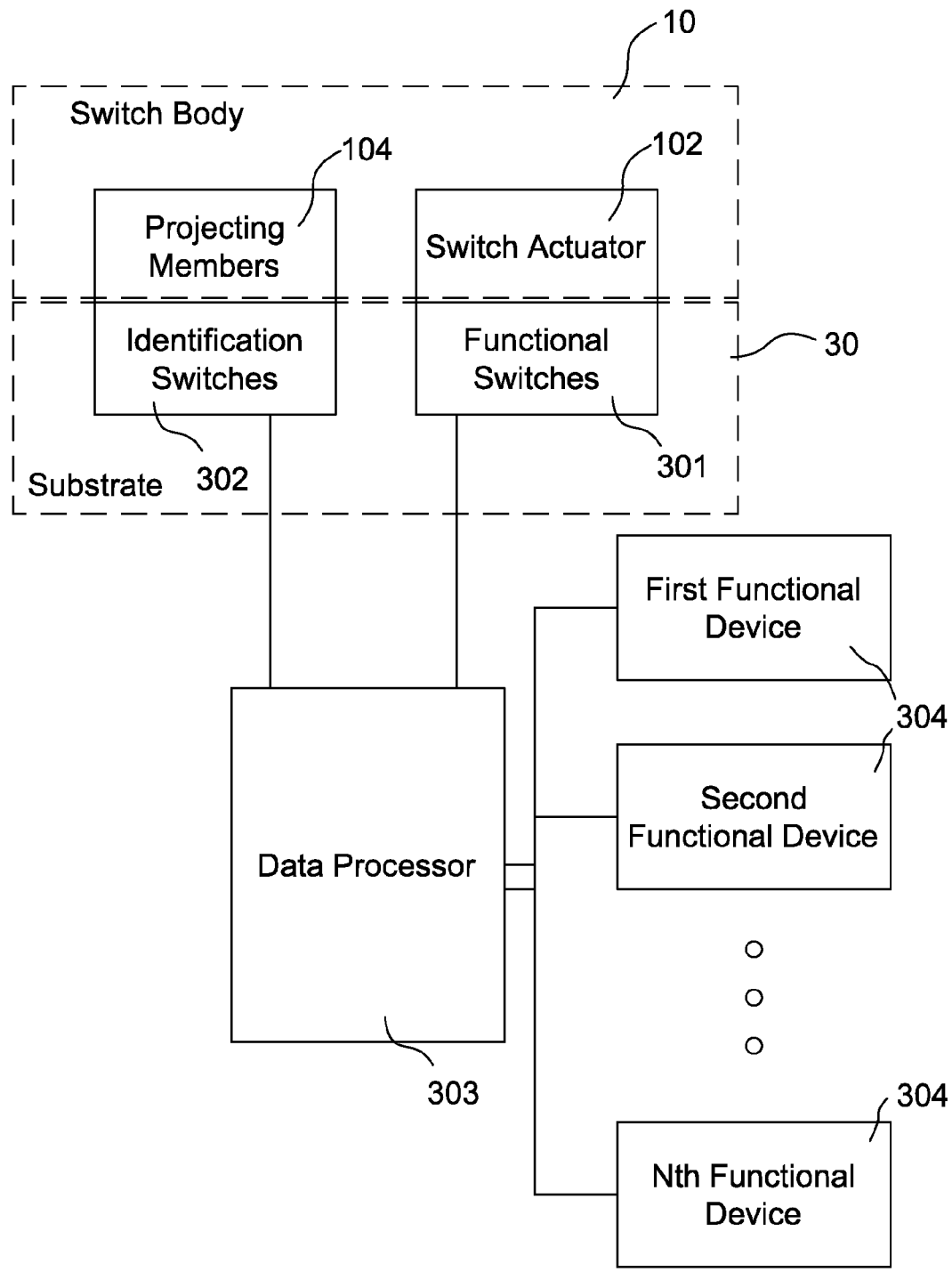
FIG. 4 is a block diagram of the switch assembly.

FIG. 4 is a block diagram showing the electrical functionality of the switch assembly 11. Like reference numbers in FIG. 1A and FIG. 4 indicate like elements.

The data processor 303 is coupled to identification switches 302, functional switches 301 and one or more functional devices 304. Although the data processor 303, identification switches 302, functional switches 301 and one or more functional devices 304 may be associated with (e.g., mounted on) the substrate 30, in an alternate embodiment the functional devices 304 may be located separate from the substrate 30. The switch body 10 supports (or has bottom edges that terminate in) projecting members that engage one or more identification switches 302. The switch body 10 supports an actuator 102 that engages one or more identification switches 302.

The data processor 303 may comprise a microprocessor, a microcontroller, a digital signal processor, a logic circuit, a programmable logic array, or another suitable device. The identification switches 302 and functional switches 301 were previously described in conjunction with FIG. 1A and the foregoing description applied with equal force to FIG. 4. The functional device 304 comprises any circuit, component, electrical, or electronic device that is activated, deactivated, enabled, disabled, or otherwise controlled by the sending of signals (e.g., logic level or contact closures) or data to the functional device 304. Further, a functional device 304 may also comprise a software module or any other physical, logical or virtual device capable of being controlled by a data processor 303.

In one embodiment, a data processor 303 comprises at least one input terminal electrically coupled to the functional switch 301 and the identification switches 302 and at least one output terminal. A functional device 304 is coupled to the at least one output terminal. The absence or presence of projecting members 104 in certain respective positions determines the functionality, enablement or disablement of the respective functional device 304. There are $2^M$ power of possible permutations of the projecting members 104, and wherein each of M possible permutation of the projecting members 104 is associated with a corresponding functionality of a respective functional device 304.

In one configuration, the data processor 303 comprises input terminals that accept input signals or data (e.g., logic level or contact closures) from the identification switches 302 and functional switches 301. The data processor 303 has logic circuitry or other processing components that generate output signals or data at output terminals for control or data transmission to selected ones of the functional devices 304 in response to the input signals.

The projecting members 104 on the switch body 10 engage a subset of the identification switches 302. A data processor 303 reads the state of the identification switches 302 and uses the pattern or data word of active states (e.g., on state or 1) and inactive states (e.g., off states or 0) of the identification switches 302 to create a unique identity code for the switch body 10. For example, the data word for the top configuration of projecting members 104 in FIG. 3 could be a sixteen long bit word with each digit set to 1, whereas the data word for the bottom configuration of FIG. 3 could be "1001010100110111."

The switch actuator 102 moves or pivots if a user or person operates the upper portion 101, resulting in the actuator 102 engaging the functional switches 301. The data processor 303 reads the state of the functional switches 301. The data processor 303 uses the unique identity code created by the identification switches 302 to determine how the state of the functional switches 301 should be interpreted and applied to provide control signals or data (e.g., data words) to one or more functional devices 304, which may range from a first functional device to an Nth functional device. For example, based on the identity code created by the identification switches 302, the data processor 303 will determine to which of several separate functional devices 304 the state of the functional switches 301 should be applied.

In one illustrative example, a switch body 10 with only one of four possible projecting members 104 present might have a unique identity code of "0001", where a 0 represents the "off" state of three of the identification switches 302 and a 1 represents the "on" state of the one identification switch currently being engaged by the single projecting member 104. In another illustrative example, the second switch body 10 may have two of four possible projecting members 104 present, giving it a unique identity code of "0101". These different identity codes are thus interpreted by the data processor 303 to determine which of the functional devices 304 should be controlled based on the current state of the functional switches 301.

Having described the preferred embodiment, it will become apparent that various modifications can be made without departing from the scope of the invention as defined in the accompanying claims. In an alternate embodiment, the functional switch and its associated switch body can be replaced by a keypad, joysticks, rotary knobs, pushbuttons, or any appropriate type of control which can be mounted in a panel cover as described herein. Also, instead of having members 104 that project out from the bottom of the outer enclosure 103 to activate the identification switches 302, it would be possible to embed a material such as metal or a magnet inside the outer enclosure 103 such that a position of the material is detectable by a corresponding proximity sensor on the circuit board 30. Proximity sensors can detect the absence or presence the material as it populates different positions on the switch body or outer enclosure 103. Types of proximity sensors which may be used to detect the movement of the switch actuator 102 include one or more of the following: magneto-resistive sensors (e.g., for detecting changes in resistance in response to a change in a magnetic field); Hall Effect sensors (e.g., for detecting changes in a magnetic field caused by the presence of metal or a magnet); capacitive sensors (e.g., for detecting changes in an electro-static field caused by the proximity of an object), and inductive sensors (e.g., for detecting eddy current losses caused by the presence of metal in an electro-magnetic field).

The following is claimed:

1. An electrical switch assembly comprising:
    a generally planar substrate having a functional switch and one or more identification switches;
    a switch body supporting a switch actuator that is movable between a first position and a second position, the switch actuator operatively engaging only the functional switch without engaging the identification switches; and an arrangement of one or more projecting members extending from the switch body, the switch body is associated with the substrate such that upon installation of the switch body the arrangement operatively engages at least one movable activating member of the identification switches to create a unique electronic identifier of electrical states of the identification switches for the electrical switch assembly.

2. The electrical switch assembly of claim 1 wherein each of the identification switches comprises a contact switch associated with a first electrical state that changes to a second electrical state, distinct from the first electrical state, in response to the identification switch being engaged by a corresponding projecting member of the arrangement.

3. The electrical switch assembly of claim 1 wherein the identification switches comprise momentary contact switches; each of the contact switches having a normally open state, and at least a subset of the contact switches having a closed state in response to engagement of the subset by the arrangement of projecting members.

4. The electrical switch assembly of claim 1, wherein the identification switches comprise momentary contact switches; each of the contact switches having a normally closed state, and at least a subset of the contact switches having an open state in response to engagement of the subset by the arrangement of projecting members.

5. The electrical switch assembly of claim 1 further comprising:
    a panel connected to the substrate, the panel having an opening;
    the switch body retained in the opening by a snap-fit connector.

6. The electrical switch assembly of claim 5 wherein the panel is spaced apart from the substrate by a spacing determined by at least one of a standoff and a spacer such that the projecting members depress the subset of the identification switches by a desired displacement to actuate the subset.

7. The electrical switch assembly of claim 1 further comprising:
    a snap-fit connector comprising a first portion and a second portion for engaging the first portion;
    a switch body associated with the first portion of the snap-fit connector;
    a panel connected to the substrate, the panel having a wall associated with the second portion of the snap-fit connector;
    a spacer interposed between the panel and the substrate, the snap-fit connector and spacer cooperating to facilitate proper alignment and registration of the projecting members with respect to the substrate and identification switches.

8. The electrical switch assembly of claim 1 further comprising:
    a data processor comprising at least one input terminal electrically coupled to the functional switch and the identification switches and at least one output terminal; and
    a functional device coupled to the at least one output terminal.

9. The electrical switch assembly of claim 8 wherein the absence or presence of projecting members in certain respective positions determines the functionality, enablement or disablement of the functional device.

10. The electrical switch assembly of claim 1 wherein there are $2^M$ power of possible permutations of the projecting members, and wherein each of M possible permutation of the projecting members is associated with a corresponding functionality of a respective functional device.

11. The electrical switch assembly of claim 1 wherein the functional switch comprises two or more momentary contact switches a subset of which become operatively engaged depending on the position of the switch actuator.

12. An operator control assembly comprising:
a generally planar substrate having a functional switch and at least one identification switch;
an operator control body supporting a switch actuator that is movable between at least a first position and a second position, the switch actuator operatively engaging only the functional switch without engaging the identification switches; and an arrangement of one or more projecting members extending from the operator control body, the operator control body mounted on or to the substrate such that upon installation of the switch body the arrangement operatively engages a movable activating member of at least some of the identification switches to create a unique electronic identifier of electrical states of the identification switches for the operator control assembly.

13. The operator assembly of claim 12 wherein each of the identification switches comprises a contact switch associated with a first electrical state that changes to a second electrical state, distinct from the first electrical state, in response to the identification switch being engaged by a corresponding projecting member of the arrangement.

14. The operator assembly of claim 12 wherein the identification switches comprise momentary contact switches; each of the contact switches having a normally open state, and at least a subset of the contact switches having a closed state in response to engagement of the subset by the arrangement of projecting members.

15. The operator assembly of claim 12 wherein the identification switches comprise momentary contact switches; each of the contact switches having a normally closed state, and at least a subset of the contact switches having an open state in response to engagement of the subset by the arrangement of projecting members.

16. The operator assembly of claim 12 further comprising:
a panel connected to the substrate, the panel having an opening;
the switch body retained in the opening by a snap-fit connector.

17. The operator assembly of claim 16 wherein the panel is spaced apart from the substrate by a spacing determined by at least one of a standoff and a spacer such that the projecting members depress the subset of the identification switches by a desired displacement to actuate the subset.

18. The operator assembly of claim 12 further comprising:
a switch body associated with the first portion of the snap-fit connector;
a panel connected to the substrate, the panel having a wall associated with the second portion of the snap-fit connector;
a spacer interposed between the panel and the substrate, the snap-fit connector and spacer cooperating to facilitate proper alignment and registration of the projecting members with respect to the substrate and identification switches.

19. The operator assembly of claim 12 further comprising:
a data processor comprising at least one input terminal electrically coupled to the functional switch and the identification switches and at least one output terminal; and
a functional device coupled to the at least one output terminal.

20. The operator assembly of claim 19 wherein the absence or presence of projecting members in certain respective positions determines the functionality, enablement or disablement of the functional device.

21. The operator assembly of claim 12 wherein there are $2^M$ power of possible permutations of the projecting members, and wherein each of M possible permutation of the projecting members is associated with a corresponding functionality of a respective functional device.

22. The operator assembly of claim 12 wherein the functional switch comprises two or more momentary contact switches a subset of which become operatively engaged depending on the position of the switch actuator.

23. The electrical switch assembly of claim 1 wherein said one or more projecting members have a generally cylindrical, columnar, conical or polygonal shape.

24. The electrical switch assembly of claim 1 wherein the switch body and the substrate are composed of the same or similar material composition to reduce any differential in thermal expansion, where the material composition is selected from the group consisting of a polymer, a polymer matrix and filler, plastic, and plastic matrix and filler.

* * * * *